US010410840B2

(12) United States Patent
Mizutani et al.

(10) Patent No.: US 10,410,840 B2
(45) Date of Patent: Sep. 10, 2019

(54) GAS SUPPLYING METHOD AND SEMICONDUCTOR MANUFACTURING APPARATUS

(71) Applicant: Tokyo Electron Limited, Tokyo (JP)

(72) Inventors: Tomoyuki Mizutani, Beaverton, OR (US); Hiroshi Tsujimoto, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 913 days.

(21) Appl. No.: 14/614,900

(22) Filed: Feb. 5, 2015

(65) Prior Publication Data

US 2015/0228460 A1   Aug. 13, 2015

(30) Foreign Application Priority Data

Feb. 12, 2014  (JP) ................. 2014-024772

(51) Int. Cl.
*H01J 37/32* (2006.01)
*H01L 21/311* (2006.01)
(Continued)

(52) U.S. Cl.
CPC .... *H01J 37/32449* (2013.01); *H01J 37/3244* (2013.01); *H01L 21/31138* (2013.01);
(Continued)

(58) Field of Classification Search
CPC ... C23C 14/52; C23C 14/54; C23C 16/45523; C23C 16/45577; H01J 2237/332;
(Continued)

(56) References Cited

U.S. PATENT DOCUMENTS 2,999,482 A * 9/1961 Bower ............... F15B 11/0426
137/599.04
4,004,884 A * 1/1977 Zdrodowski ........... G01N 30/34
137/624.12
(Continued)

FOREIGN PATENT DOCUMENTS

JP  2011-165769  8/2011
WO  WO-02086327 A1 * 10/2002 ......... F15B 11/0426
WO  WO-2013128181 A1 * 9/2013 ............. C23C 16/52

OTHER PUBLICATIONS

Strem Chemicals, Inc. "MOCVD, CVD & ALD Precursors." 2012. pp. 1-57. https://www.strem.com/. (Year: 2012).*
(Continued)

*Primary Examiner* — Jeffrie R Lund
*Assistant Examiner* — Stanislav Antolin
(74) *Attorney, Agent, or Firm* — IPUSA, PLLC

(57) ABSTRACT

A gas supplying method of supplying a process gas containing a gas of at least one gaseous species into a process space in a semiconductor manufacturing apparatus includes supplying the process gas by controlling a flow rate value of the gas to be a first value during a first period; supplying the process gas by controlling the flow rate value of the gas to be a second value smaller than the first value during a second period; supplying the process gas by controlling the flow rate value of the gas to be a third value greater than the first value during a third period; and supplying the process gas by controlling the flow rate value of the gas to be a fourth value smaller than the second value during a fourth period, wherein these steps are periodically repeated in a predetermined order.

6 Claims, 9 Drawing Sheets

US 10,410,840 B2

Page 2

(51) Int. Cl.
*H01L 21/67* (2006.01)
*C23C 14/54* (2006.01)
*C23C 16/455* (2006.01)

(52) U.S. Cl.
CPC .. *H01L 21/67109* (2013.01); *H01L 21/67253* (2013.01); *C23C 14/54* (2013.01); *C23C 16/45523* (2013.01); *Y10T 137/0324* (2015.04)

(58) Field of Classification Search
CPC ............ H01J 2237/334; H01J 37/32009; H01J 37/3244; H01J 37/32449; H01J 37/32862; H01J 37/32935; H01J 37/32972; H01J 37/3299; H01L 21/0206; H01L 21/02252; H01L 21/02274; H01L 21/0262; H01L 21/28556; H01L 21/3065; H01L 21/31116; H01L 21/31138; H01L 21/32136; H01L 21/67028; H01L 21/67069; H01L 21/67109; H01L 21/67253; Y10T 137/0324
See application file for complete search history.

(56) References Cited

U.S. PATENT DOCUMENTS

| | | | | |
|---|---|---|---|---|
| 4,162,689 | A * | 7/1979 | Zdrodowski | G01F 13/006 137/266 |
| 4,325,347 | A * | 4/1982 | Yamaguchi | F02D 41/0077 123/568.27 |
| 4,345,610 | A * | 8/1982 | Herter | B01F 3/026 137/624.15 |
| 4,888,199 | A * | 12/1989 | Felts | C23C 14/0042 204/192.13 |
| 6,051,503 | A * | 4/2000 | Bhardwaj | H01L 21/30655 216/37 |
| 6,176,930 | B1 * | 1/2001 | Koai | C23C 16/4486 118/715 |
| 6,178,995 | B1 * | 1/2001 | Ohmi | G05D 7/0635 137/486 |
| 6,185,839 | B1 * | 2/2001 | Kholodenko | H01J 37/3244 34/210 |
| 6,197,123 | B1 * | 3/2001 | Poag | C23C 16/4405 134/18 |
| 8,440,473 | B2 | 5/2013 | Xu et al. | |
| 2001/0002581 | A1 * | 6/2001 | Nishikawa | C23C 16/455 118/715 |
| 2002/0029851 | A1 * | 3/2002 | Edamura | H01J 37/32935 156/345.12 |
| 2004/0200529 | A1 * | 10/2004 | Lull | G05D 7/0664 137/487.5 |
| 2004/0237893 | A1 * | 12/2004 | Park | C23C 16/403 118/715 |
| 2004/0244837 | A1 * | 12/2004 | Nawata | G05D 7/0635 137/487.5 |
| 2005/0194354 | A1 * | 9/2005 | Onishi | H01J 37/3244 216/67 |
| 2005/0241763 | A1 * | 11/2005 | Huang | C23C 16/45561 156/345.33 |
| 2006/0110533 | A1 * | 5/2006 | Hwang | C23C 16/34 427/248.1 |
| 2006/0165890 | A1 * | 7/2006 | Kaushal | C23C 16/45527 427/248.1 |
| 2006/0166501 | A1 * | 7/2006 | Kaushal | C23C 16/45527 438/685 |
| 2007/0054475 | A1 * | 3/2007 | Lee | C23C 16/305 438/483 |
| 2007/0167028 | A1 * | 7/2007 | Chou | C23C 16/36 438/758 |
| 2008/0038920 | A1 * | 2/2008 | Goswami | C23C 16/04 438/680 |
| 2008/0157278 | A1 * | 7/2008 | Do | H01L 28/65 257/532 |
| 2008/0223555 | A1 * | 9/2008 | Di Stefano | F25B 49/02 165/101 |
| 2008/0314367 | A1 * | 12/2008 | Goulette | F02D 41/20 123/472 |
| 2009/0053900 | A1 * | 2/2009 | Nozawa | C23C 16/45502 438/710 |
| 2009/0114284 | A1 * | 5/2009 | Siivonen | F15B 11/006 137/1 |
| 2009/0162950 | A1 * | 6/2009 | Kuboi | H01J 37/32935 438/5 |
| 2009/0253265 | A1 * | 10/2009 | Inokuchi | C23C 16/24 438/694 |
| 2009/0277872 | A1 * | 11/2009 | Yamamoto | H01J 37/32935 216/60 |
| 2010/0012027 | A1 * | 1/2010 | Poignant | C23C 16/4486 118/692 |
| 2010/0130024 | A1 * | 5/2010 | Takasawa | C23C 16/45531 438/761 |
| 2010/0139775 | A1 * | 6/2010 | Ohmi | G01F 1/363 137/12 |
| 2010/0162952 | A1 * | 7/2010 | Yamazaki | C23C 16/403 118/692 |
| 2010/0191361 | A1 * | 7/2010 | McCready | G05B 13/048 700/104 |
| 2010/0192854 | A1 * | 8/2010 | Nishino | C23C 16/455 118/692 |
| 2011/0003087 | A1 * | 1/2011 | Soininen | C23C 16/45536 427/569 |
| 2011/0020989 | A1 * | 1/2011 | Tajima | C23C 16/24 438/158 |
| 2011/0094996 | A1 * | 4/2011 | Yamazawa | H01J 37/321 216/68 |
| 2011/0174380 | A1 * | 7/2011 | Itafuji | H01L 21/6719 137/1 |
| 2011/0174661 | A1 * | 7/2011 | Chen | C04B 41/009 206/524.3 |
| 2011/0174672 | A1 * | 7/2011 | Chen | C23C 14/0015 206/524.6 |
| 2011/0174674 | A1 * | 7/2011 | Chen | C23C 14/0015 206/524.6 |
| 2011/0186545 | A1 * | 8/2011 | Mahadeswaraswamy | H01J 37/32935 216/59 |
| 2011/0195577 | A1 * | 8/2011 | Kushibiki | H01J 37/32091 438/714 |
| 2011/0256724 | A1 * | 10/2011 | Chandrasekharan | C23C 16/4481 438/694 |
| 2012/0037316 | A1 * | 2/2012 | Ogasawara | H01J 37/32091 156/345.51 |
| 2012/0038277 | A1 * | 2/2012 | Eto | H01J 37/32091 315/111.21 |
| 2012/0048467 | A1 * | 3/2012 | Mahadeswaraswamy | H01J 37/32522 156/345.27 |
| 2012/0073672 | A1 * | 3/2012 | Ding | C23C 16/448 137/14 |
| 2012/0079985 | A1 * | 4/2012 | Yamazaki | C23C 16/405 118/724 |
| 2012/0132397 | A1 * | 5/2012 | Silveira | H01J 37/20 165/104.13 |
| 2012/0220135 | A1 * | 8/2012 | Nakagawa | H01L 21/31116 438/714 |
| 2012/0225502 | A1 * | 9/2012 | Nakagawa | H01L 21/31116 438/14 |
| 2012/0305188 | A1 * | 12/2012 | Kato | H01J 37/3244 156/345.26 |
| 2012/0309198 | A1 * | 12/2012 | Xu | H01J 37/32972 438/702 |
| 2012/0310403 | A1 * | 12/2012 | Morisawa | H01J 37/32935 700/121 |
| 2013/0093048 | A1 * | 4/2013 | Chang | H01L 21/02112 257/532 |

(56) References Cited

U.S. PATENT DOCUMENTS

| | | | |
|---|---|---|---|
| 2013/0244408 A1* | 9/2013 | Moseley | C30B 23/02 |
| | | | 438/478 |
| 2013/0248490 A1* | 9/2013 | Rasmussen | H01J 37/023 |
| | | | 216/83 |
| 2013/0252439 A1* | 9/2013 | Hirose | C23C 16/30 |
| | | | 438/778 |

OTHER PUBLICATIONS

Strem Chemicals, Inc. "MOCVD, CVD & ALD Precursors." 2014. pp. 1-63. https://www.strem.com/. (Year: 2014).*

* cited by examiner

GAS SUPPLYING METHOD AND SEMICONDUCTOR MANUFACTURING APPARATUS

CROSS-REFERENCE TO RELATED APPLICATIONS

This patent application is based upon and claims the benefit of priority of Japanese Patent Application No. 2014-024772 filed on Feb. 12, 2014, the entire contents of which are incorporated herein by reference.

BACKGROUND OF THE INVENTION

1. Field of the Invention

The present invention generally relates to a gas supplying method and a semiconductor manufacturing apparatus.

2. Description of the Related Art

In manufacturing a semiconductor, proposed is a "pulse control of a gas flow rate" with which a process gas having two different flow rate values are each switched by several seconds and repeatedly supplied at a time of supplying the process gas containing at least one gaseous species into a process space (see Japanese Laid-Open Patent Publication No. 2011-165769 and U.S. Pat. No. 8,440,473). As an example of the pulse control of the gas flow rate, the flow rate value of a gas A is set to be different from the flow rate value of a gas B and the gases A and B are alternately supplied like a pulse. As another example of the pulse control of the gas flow rate, the flow rate value of the gas A is set to have two different flow rate values and the two different flow rate values of the gas A are alternately switched over like a pulse in supplying the gas A. By performing the pulse control of the gas flow rate, so-called micro-loading, an etching rate is changed depending on sizes of a hole size or a trench size.

However, in a gas control method of switching between two different flow rate values, i.e., a flow rate value on a high flow rate side (hereinafter, a high flow rate value) and a flow rate value on a low flow rate side (hereinafter, a low flow rate value), a long time is required to reach the high flow rate value or the low flow rate value after switching from the low flow rate value or the high flow rate value, respectively. Therefore, as illustrated in FIG. 1, the actually supplied gas cannot reach a set flow rate during rising and falling after switching the gases. Therefore, a control for switching to a next gas flow rate occurs before reaching the set flow rate value. Thus, the gas flow rate of the actually supplied gas becomes lower than a preset gas flow rate, and there may occur a case where a predetermined property is not obtainable for a processed substrate.

SUMMARY OF THE INVENTION

Accordingly, embodiments of the present invention may provide a novel and useful gas supplying method and a semiconductor manufacturing apparatus solving one or more of the problems discussed above.

According to an aspect of the present invention, there is provided a gas supplying method of supplying a process gas containing a gas of at least one gaseous species into a process space in a semiconductor manufacturing apparatus including a first step of supplying the process gas containing the gas by controlling a flow rate value of the gas to be a first flow rate value during a first period; a second step of supplying the process gas containing the gas by controlling the flow rate value of the gas to be a second flow rate value smaller than the first flow rate value during a second period; a third step of supplying the process gas containing the gas by controlling the flow rate value of the gas to be a third flow rate value greater than the first flow rate value during a third period; and a fourth step of supplying the process gas containing the gas by controlling the flow rate value of the gas to be a fourth flow rate value smaller than the second flow rate value during a fourth period, wherein the first step, the second step, the third step, and the fourth step are periodically repeated in a predetermined order.

According to another aspect of the present invention, there is provided semiconductor manufacturing apparatus including a gas supply source that supplies a process gas containing a gas of at least one gaseous species into a process space in a chamber; a gas flow rate controller that controls a flow rate of the process gas; and a control unit that controls a supply of the process gas, wherein the control unit supplies the process gas containing the gas by controlling a flow rate value of the gas to be a first flow rate value during a first period, the control unit supplies the process gas containing the gas by controlling the flow rate value of the gas to be a second flow rate value smaller than the first flow rate value during a second period, the control unit supplies the process gas containing the gas by controlling the flow rate value of the gas to be a third flow rate value greater than the first flow rate value during a third period, and the control unit supplies the process gas containing the gas by controlling the flow rate value of the gas to be a fourth flow rate value smaller than the second flow rate value during a fourth period, wherein the first step, the second step, the third step, and the fourth step are periodically repeated in a predetermined order.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Reference symbols typically designate as follows:
1: plasma processing apparatus;
10: chamber;
15: gas supply source;
16: gas flow rate controller;
20: lower electrode (mounting stage);
25: upper electrode;
65: evacuation device;
80: end point detection apparatus;
81: measurement window;
100: control unit; and
W: wafer.

A description of embodiments of the present invention is given below, with reference to the FIG. 1 through FIG. 10.

The embodiments described below are only examples and the present invention is not limited to the embodiments.

Through all figures illustrating the embodiments, the same references symbols are used for portions having the same structure or function, and repetitive explanations of these portions are omitted in the specification and the figures.

[Structure of Semiconductor Manufacturing Apparatus]

Figure 2:
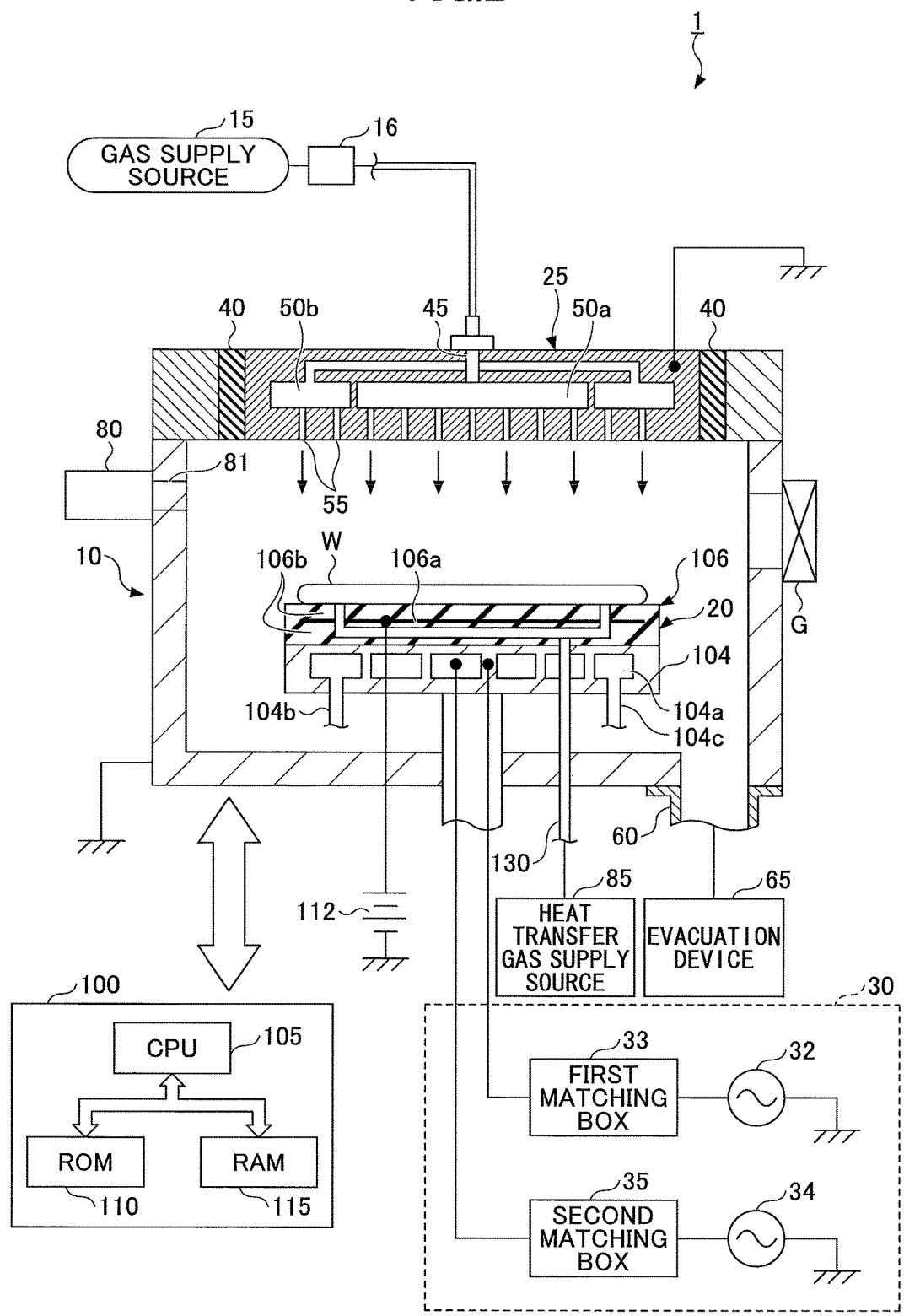
FIG. 2 illustrates an exemplary semiconductor manufacturing apparatus of an embodiment.

Referring to FIG. 2, a structure of a semiconductor manufacturing apparatus of an embodiment is described. FIG. 2 illustrates a structure of a plasma processing apparatus as an example of a semiconductor manufacturing apparatus of the embodiment.

Referring to FIG. 2, a plasma processing apparatus of a parallel plate type is exemplified. The plasma processing apparatus of the parallel plate type includes a lower electrode 20 (a mounting table) and an upper electrode 25 (a shower head) arranged inside a chamber so as to face each other and a process gas is supplied into the chamber from the upper electrode 25.

This plasma processing apparatus 1 includes a chamber 10 made of a conductive material such as aluminum and a gas supply source 15 for supplying a gas into the chamber 10. The chamber 10 is electrically grounded. The gas supply source 15 supplies process gases at flow rates each set for corresponding processes of etching. The gas flow rate controller 16 adjusts the flow rate of the process gas by controlling an opening degree of a valve installed inside the gas flow rate controller 16. Although it is not illustrated in FIG. 1, the gas flow rate controller 16 is provided for each of gaseous species supplied from the corresponding gas supply sources 15.

The chamber 10 is electrically grounded. Inside the chamber 10, a lower electrode 20 and an upper electrode 25 arranged in parallel to the lower electrode 20 and facing the lower electrode 20. The lower electrode 20 functions as a mounting stage for mounting a semiconductor wafer W (hereinafter, simply referred to as a "wafer W"). The wafer W is an exemplary substrate to be etched.

An electrostatic chuck 106 is provided on the upper surface of the mounting stage (the lower electrode 20) to electrostatically attract the wafer W. The electrostatic chuck 106 has a structure of sandwiching a chuck electrode 106a inside an insulator 106b. A direct voltage source 112 is connected to the chuck electrode 106a. By applying a direct voltage from the direct voltage source 112 to an electrode 106a, the wafer is attracted by the electrostatic chuck 106 due to a coulomb force.

The mounting stage (the lower electrode 20) is supported by a supporting body 104. A refrigerant flow path 104a is formed inside the supporting body 104. A refrigerant inlet pipe 104b and a refrigerant outlet pipe 104c are connected to a refrigerant flow path 104a. A refrigerant such as cooling water circulates through the refrigerant flow path 104a.

A heat transfer gas supply source 85 supplies a heat transfer gas such as a helium (He) gas or an argon (Ar) gas onto the back surface of the wafer W after causing the heat transfer gas to pass through a gas supply line 130. Due to this structure, the temperature of the electrostatic chuck 106 is controlled by the cooling water circulating through the refrigerant flow path 104a and the heat transfer gas supplied onto the back surface of the wafer W. As a result, the temperature of the wafer W can be controlled to be a predetermined temperature.

A power supply device 30 for supplying dual frequency superimposed power is connected to a lower electrode 20. The power supply device 30 includes a first high-frequency power source 32 for supplying first high frequency power (high frequency power for plasma excitation) at a first frequency and a second high-frequency power source for supplying second high frequency power (high frequency power for bias voltage generation) at a second frequency lower than the first frequency. The first high-frequency power source 32 is electrically connected to the lower electrode 20 through the first matching box 33. The second high-frequency power source 34 is electrically connected to the lower electrode 20 through the second matching box 35. The first high-frequency power source 32 supplies the first high frequency power at 40 MHz. The second high-frequency power source 34 supplies the second high frequency power at 3.2 MHz.

The first matching box 33 and the second matching box 35 are provided to cause load impedances to match internal impedances (output impedances) of the first high-frequency power source 32 and the second high-frequency power source 34, respectively. The first matching box 33 and the second matching box 35 function such that the load impedances seemingly match the internal impedances (output impedances) of the first high-frequency power source 32 and the second high-frequency power source 34, respectively, when plasma is generated inside the chamber 10.

Figure 1:
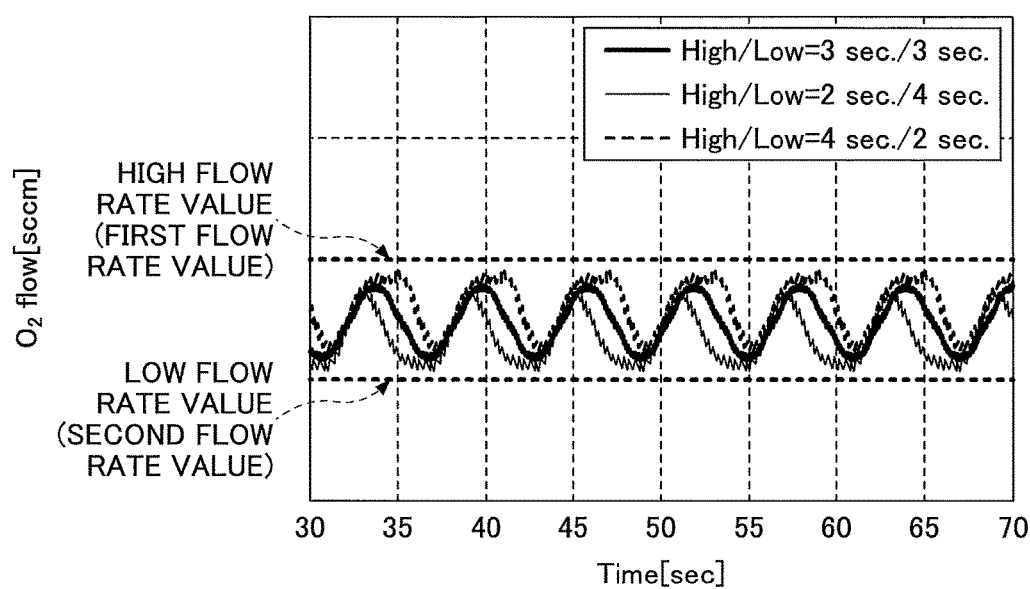
FIG. 1 illustrates an exemplary action of a gas flow rate in a chamber.

The upper electrode 25 is attached to a ceiling portion of the chamber 10 through a shield ring 40 covering a peripheral portion of the ceiling portion. The upper electrode 25 may be electrically grounded as illustrated in FIG. 1 or may be structured to be connected to a variable direct current (DC) source (not illustrated) so that a predetermined direct current (DC) voltage is applied to the upper electrode 25.

A gas introduction port 45 for introducing the gas from the gas supply source 15 is formed in the upper electrode 25. A diffusion chamber 50a on a center side and a diffusion chamber 50b on an edge side are provided inside the upper electrode 25 to diffuse the gas being introduced from a gas introduction port 45 and branching into the diffusion chambers 50a and 50b.

A great number of gas supply apertures 55 are formed in the upper electrode 25 so as to supply the gas from the diffusion chambers 50a and 50b into the chamber 10. Each gas supply aperture 55 is arranged so as to be able to supply the gas between the wafer W mounted on the lower electrode 20 and the upper electrode 25.

The gas supplied from the gas supply source 15 is supplied into the diffusion chambers 50a and 50b through the gas introduction port 45. The gas diffuses in the diffusion chambers 50a and 50b, is distributed to the gas supply apertures 55, and is introduced from the gas supply apertures 55 toward the lower electrode 20. The upper electrode 25 functions as a gas shower head for supplying the gas.

An evacuation port 60 is formed on a bottom surface of the chamber 10. By evacuating using an evacuation device 65 connected to the evacuation port 60, the inside of the chamber 10 can be maintained to have a predetermined degree of vacuum. A gate valve G is provided on a side wall of the chamber 10. The gate valve G opens and closes a carry-in and carry-out port where the wafer W is carried into the chamber 10 or carried out of the chamber 10.

The end point detection apparatus 80 (EDP: end point detector) is attached to the side wall of the chamber 10 of the plasma processing apparatus 1 and measures an emission intensity of plasma inside a plasma generation space through a measurement window 81.

A control unit 100 is provided to control an overall operation of the plasma processing apparatus 1. The control unit 100 includes a central processing unit (CPU) 105, a read only memory (ROM) 110, and a random access memory (RAM) 115. The CPU 105 performs various processes of etching (described below) in conformity with various recipes stored in memory areas of the central processing unit (CPU) 105, the read only memory (ROM) 110, and the random access memory (RAM) 115. Within the embodiment, data indicative of a correlative relationship between the emission intensity of a predetermined gaseous species at a specific wavelength and the flow rate value of the gaseous species are stored in the ROM 110 or the RAM 115. The data of the correlative relationship are obtainable by the emission intensity of the plasma previously measured by the end point detection apparatus 80 (EPD: end point detector) and the gas flow rate value supplied into the chamber 10 at the time of measuring the plasma. Specifically, the end point detection apparatus 80 supplies a specific gas into the chamber 10 and detects a change of the emission intensity of the plasma generated by supplying the specific gas into the chamber 10. At the time of detecting the change of the emission intensity of the plasma, the plasma is dispersed by a spectroscope (not illustrated) and is subjected to photoelectric conversion by a photoelectric convertor, and the converted electricity is amplified by an amplifier. Thus, the correlative relationship between the gas flow rate of the gaseous species and the emission intensity of the plasma is obtainable.

The recipe includes control information of the apparatus concerning process conditions such as a processing time, a pressure (the evacuated gas), high-frequency power, a voltage, a process gas flow rate, chamber temperatures (e.g., an upper electrode temperature, a chamber sidewall temperature, and an ESC temperature), or the like. Further, the recipe includes a high flow rate value of the gas, a low flow rate value of the gas, a switchover time, or the like, which are set to perform a pulse control for the process gas.

The recipe indicative of the program and the process conditions may be stored in a hard disk or a semiconductor memory. Further, the recipe indicative of the program and the process conditions may be set at a predetermined position of the memory area in a state where the recipe is accommodated in a portable recording medium such as a CD-ROM or a readable and writable DVD using a computer.

The overall structure of the plasma processing apparatus 1 of the embodiment is described above. The processes of the etching are repeatedly performed by the plasma processing apparatus 1 having this structure. The plasma processing apparatus 1 of the embodiment can be used not only to etch the wafer W but also to deposit a film on the wafer W or perform ashing of the wafer W. In these cases also, the pulse control of the gas flow rates of a film deposition gas and an ashing gas is performed by the plasma processing apparatus 1 in conformity with the gas supplying method of the embodiment described below.

[Gas Supplying Process]

Figure 3:
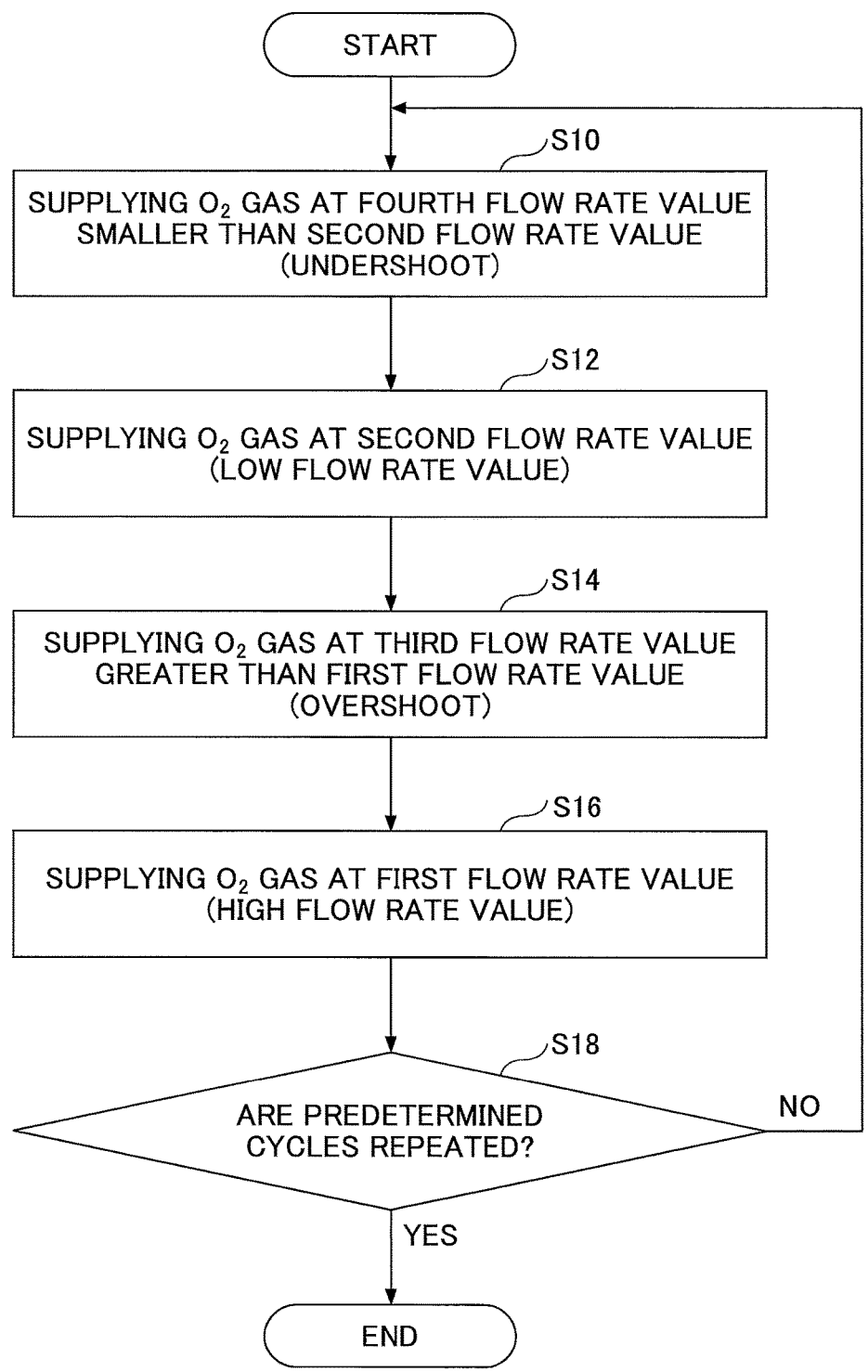
FIG. 3 is a flowchart illustrating an exemplary gas supplying process of the embodiment.

Next, referring to FIG. 3, an exemplary gas supplying process of the embodiment is described. FIG. 3 is a flowchart of performing an exemplary gas supplying process of the embodiment. The gas supplying process of the embodiment is controlled by a control unit 100 of the plasma processing apparatus 1.

(Setup of Flow Rate Value)

Before performing a gas supplying process of the embodiment, it is necessary to determine appropriate values of gas flow rate values during a rising time (an overshooting time) after switching the gas and a falling time (an undershooting time) after switching the gas. Here, described is a method of appropriately determining the gas flow rates of a single gas of an oxygen ($O_2$) gas during the overshooting time and the undershooting time.

The $O_2$ gas having a predetermined flow rate is supplied from the gas supply source 15 to a plasma generation space. The $O_2$ gas is supplied while the flow rate of the $O_2$ gas is controlled like a pulse. At this time, the high flow rate value and the low flow rate value of the $O_2$ gas are previously set based on a correlative graph between the emission intensity of plasma and the flow rate of the $O_2$ gas illustrated in FIG. 4 as an example.

The correlative graph between the emission intensity of plasma and the flow rate of the $O_2$ gas can be obtained by detecting the emission intensity of the plasma generated in a plasma generation space relative to the predetermined flow rate of a gas (here, the $O_2$ gas) of a single gaseous species supplied into the plasma generation space. The end point detection apparatus 80 changes the flow rate value of the $O_2$ gas supplied to the plasma generation space and detects the emission intensity of the plasma generated in the plasma generation space. A data group obtained as described above is stored in a memory unit such as the RAM 115 or the like. An operation of collecting the data group is performed as a preparation of the processes before actually performing the processes.

Figure 4:
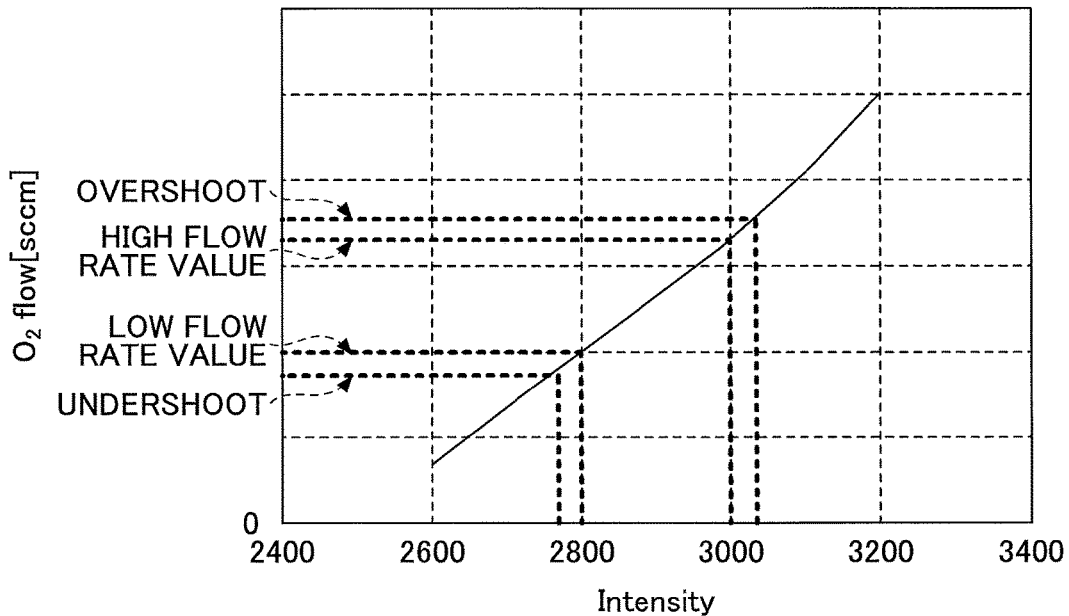
FIG. 4 is a graph illustrating an exemplary correlative relationship between an emission intensity of plasma and a flow rate of an $O_2$ gas of the embodiment.

As a result of correcting the data, FIG. 4 is obtained. Referring to FIG. 4, the emission intensity of the plasma is in proportion to the flow rate of the $O_2$ gas as indicated by a substantially straight line in FIG. 4. Therefore, by detecting the emission intensity of the plasma generated from the $O_2$ gas and converting the detected value to the flow rate of the $O_2$ gas, it is possible to determine the gas flow rates during the rising time (the overshooting time) and the falling time (the undershooting time). The high flow rate value and the low flow rate value of the $O_2$ gas is previously determined by properties of the etching process applied to the wafer W. The high flow rate value of the $O_2$ gas is an example of the first flow rate value, and the low flow rate value of the $O_2$ gas is an example of the second flow rate value. The first flow rate value is greater than the second flow rate value.

Within the embodiment, the gas flow rate value during the rising time is previously and appropriately determined based on a comparative result between the flow rate value converted as described above and the high flow rate value so that the gas flow rate value (a third flow rate value) during the rising time is greater than the high flow rate value (the first flow rate value).

Within the embodiment, the gas flow rate value at the falling time is previously and appropriately determined based on a comparative result between the flow rate value converted as described above and the low flow rate value so that the gas flow rate value (a fourth flow rate value) at the falling time is smaller than the low flow rate value (the second flow rate value).

As described, the flow rate value of the $O_2$ gas during the rising time and the flow rate value of the $O_2$ gas during the falling time can be previously determined based on the correlative graph illustrated in FIG. 4. The flow rate value during the rising time and the flow rate value at the falling time are determined to be a value with which predetermined properties are obtainable with respect to the etching provided to the wafer W. The first, second, third, and fourth flow rate values are positive and are in a relationship of: the third flow rate value>the first flow rate value>the second flow rate value>the fourth flow rate value.

Figure 5:
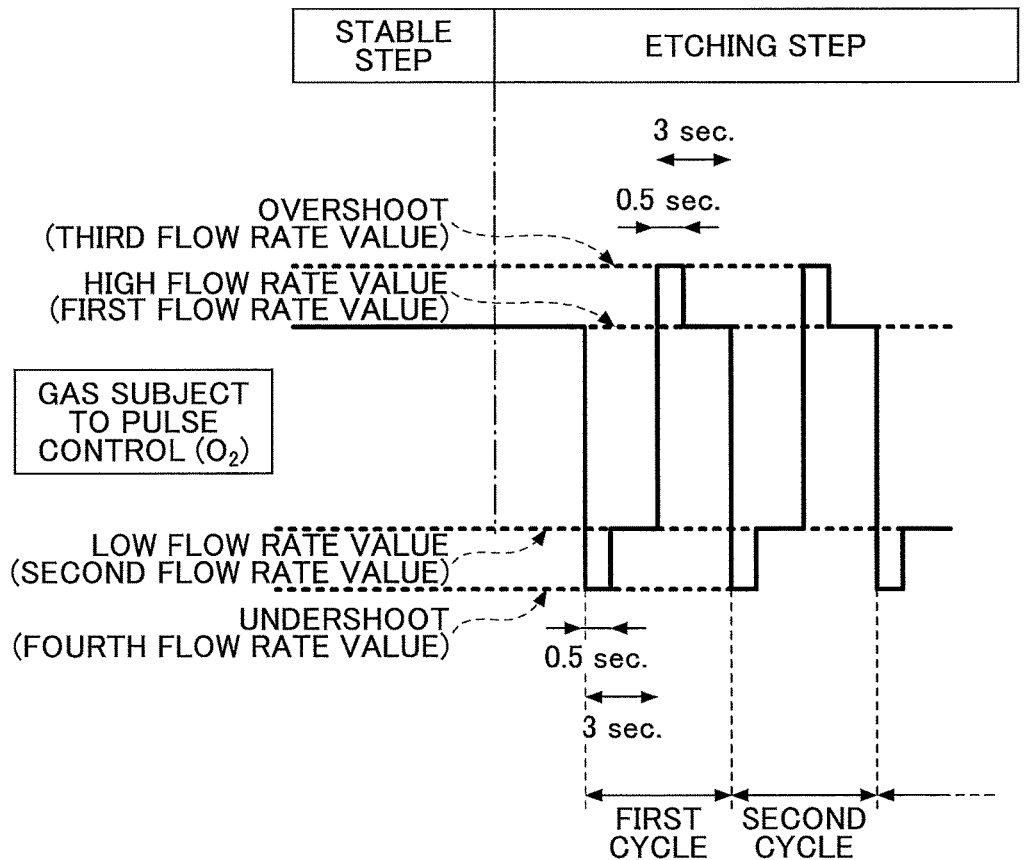
FIG. 5 illustrates an exemplary gas flow rate control sequence of the embodiment.

After the inside of the chamber 10 of the plasma processing apparatus 1 is stabilized, a gas supplying process illustrated in FIG. 3 is started. Referring to FIG. 3, the control unit 100 controls the opening degree of a valve of the gas flow rate controller 16 so as to supply the $O_2$ gas at a fourth flow rate value (step S10, a fourth process). With this, an undershooting process of controlling the flow rate to be smaller than the low flow rate value at the falling time on the low flow rate side of the $O_2$ gas illustrated in FIG. 5 is performed for 0.5 seconds (an example of a fourth period).

After a passage of this 0.5 seconds, the control unit 100 controls the opening degree of the gas flow rate controller 16 so as to supply the $O_2$ gas at the second flow rate value (step S12: a second process). With this, a process of the low flow rate value illustrated in FIG. 5 is performed. Referring to FIG. 5, the process of the low flow rate is performed for 2.5 seconds (an example of a second period). With this, the etching at the low flow rate is performed for 3.0 seconds.

Next, the control unit 100 controls the opening degree of the valve of the gas flow rate controller 16 so as to supply the $O_2$ gas at the third flow rate value (step S14: a third process). With this, an overshooting process of controlling the flow rate to be greater than the high flow rate value during the rising time on the high flow rate side of the $O_2$ gas illustrated in FIG. 5 is performed for 0.5 seconds (an example of a third period).

After a passage of this 0.5 seconds, the control unit 100 controls the opening degree of the valve of the gas flow rate controller 16 so as to supply the $O_2$ gas at the first flow rate value (step S16: a first process). With this, a process of the high flow rate value illustrated in FIG. 5 is performed. Referring to FIG. 5, the process of the high flow rate is performed for 2.5 seconds (an example of a first period). With this, the etching at the high flow rate is performed for 3.0 seconds.

Next, the control unit 100 determines whether a cycle is repeated by a predetermined number of times (step S18). In a case where the cycle is not repeated by the predetermined number of times, the process returns to step S10 and the control unit 100 repeats the processes of steps S10 to S18 again. After the cycle is repeated by the predetermined number of times, the gas supplying process illustrated in FIG. 3 is completed.

In the gas supplying process of the embodiment, the flow rates of the gas are repeatedly controlled in an order of the fourth process, the second process, the third process, and the first process. However, the gas supply method of the embodiment is not limited thereto and may be controlled in an order of the third process, the first process, the fourth process, and the second process.

Figure 6:
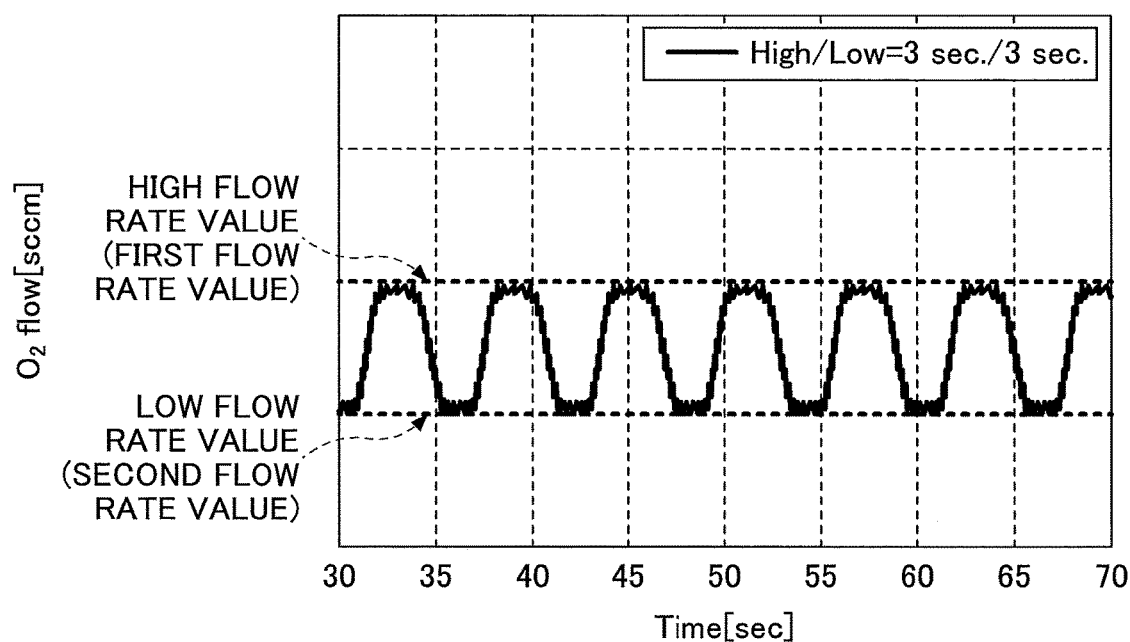
FIG. 6 illustrates an exemplary action of the gas flow rate in the chamber of the embodiment.

FIG. 6 illustrates an exemplary action of the gas flow rate in the chamber 10 when a gas supplying method of the embodiment is performed. According to the gas supplying method of the embodiment, in comparison with a case where the high flow rate and the low flow rate are repeated by every 3 seconds as illustrated in FIG. 3, the high flow rate value and the low flow rate value are attained within a short time during the rising time on the high flow rate side and the falling time on the low flow rate side. The results of the actions of the gas flow rates illustrated in FIGS. 1 and 6 are obtained from the same process conditions except for the overshooting process and the undershooting process, which do not exist in FIG. 1. Specifically, major process conditions for obtaining the actions of the gas flow rates illustrated in FIGS. 1 and 6 are the same. Within the embodiment, the pressure is set to be 40 mT (5.333 Pa), the first high frequency power is applied, and the second high frequency power is not applied.

As described, the third flow rate value supplied during the overshooting time and the fourth flow rate value supplied during the undershooting time are set by converting a detection value of the emission intensity of the plasma generated in the plasma generation space, relative to the flow rate value of the $O_2$ gas supplied to the plasma generation space, to the flow rate value of the gas of the gaseous species based on the correlative graph stored in the memory unit and illustrated in FIG. 4.

Then, the emission intensity of the plasma generated in the plasma generation space is detected in response to the supply of the $O_2$ gas controlled to have the third flow rate value, and the flow rate value of the $O_2$ gas is converted from the detection value based on the correlative graph illustrated in FIG. 4. The third flow rate value is set to be an appropriate value based on the comparative result between the converted flow rate value and the first flow rate value.

In a manner similar thereto, the emission intensity of the plasma generated in the plasma generation space is detected in response to the supply of the $O_2$ gas controlled to have the fourth flow rate value, and the flow rate value of the $O_2$ gas is converted from the detection value based on the correlative graph illustrated in FIG. 4. The fourth flow rate value is set to be an appropriate value based on the comparative result between the converted flow rate value and the second flow rate value.

As described above, in the gas supplying method of the embodiment, by providing the undershooting process and the overshooting process at the time of the pulse control of the gas flow rate, the flow rate of the gas immediately reaches the set flow rate vale at the time of switching the gas. Therefore, the gas of the appropriate flow rate can be supplied into the chamber 10. With this, it is possible to prevent a so-called micro-loading where an etching rate is changed depending on the size of a hole size and to provide a desired etching process with the wafer W.

[Time Ratio Control]
(Duty Ratio: 50%)

Figure 7:
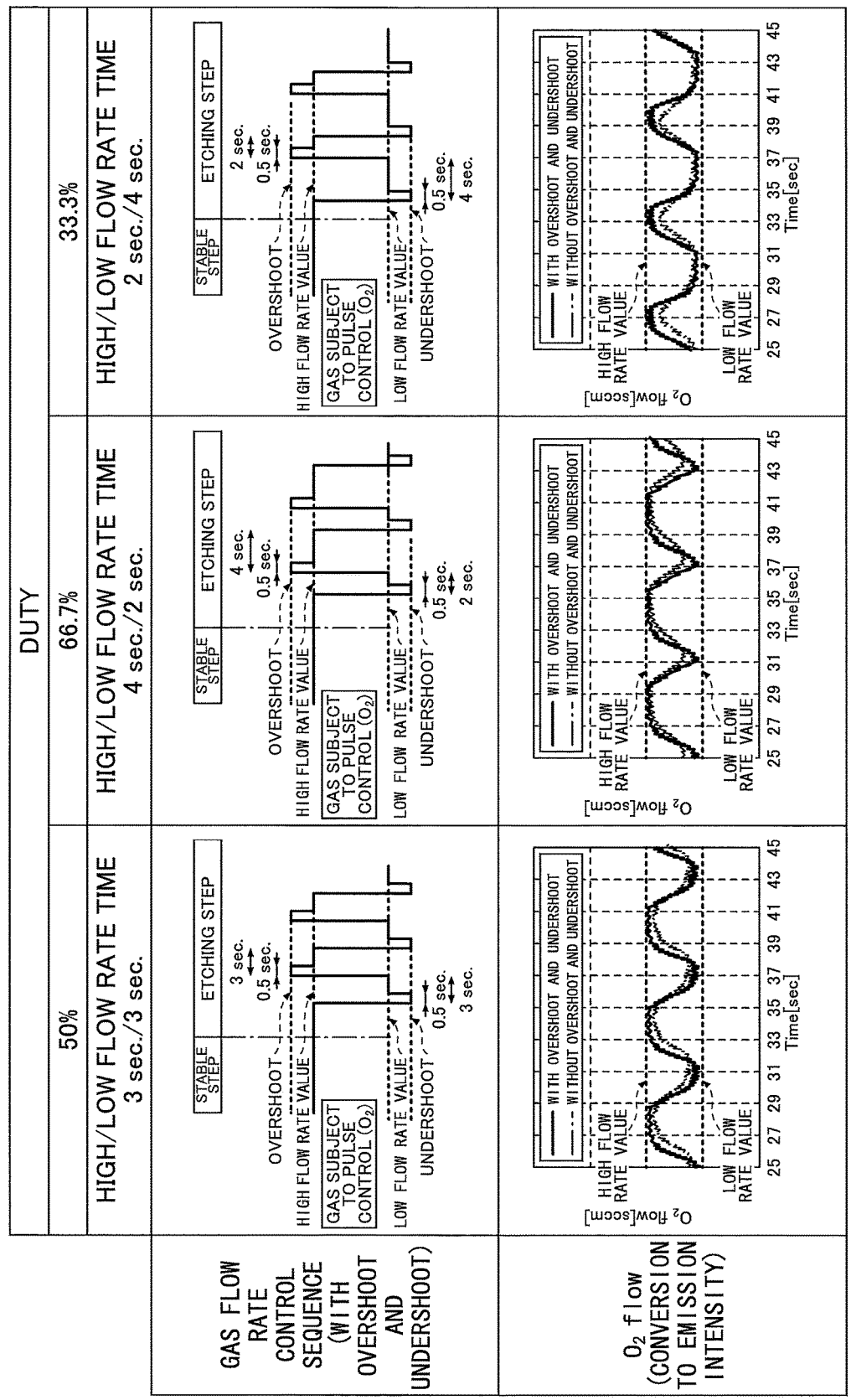
FIG. 7 illustrates an exemplary gas flow rate control sequence of the embodiment.

Referring to FIG. 7, a control of a time ratio (hereinafter, referred to as a duty ratio) in the gas supplying process of the embodiment is described. Within the embodiment, the duty ratio is indicated using a time while the flow rate is controlled to be the low flow rate value and the undershooting process is performed relative to one cycle (the sum of a time while the flow rate is controlled to be the high flow rate value and the overshooting process is performed and the time while the flow rate is controlled to be the low flow rate value and the undershooting process is performed). However, the duty ratio is a value indicative of a ratio between the time while the flow rate is controlled to be the high flow rate value and the time while the flow rate is controlled to be the low flow rate value.

The result of the action of the gas flow rate of the $O_2$ gas illustrated in FIG. 6 is obtained by the periodical pulse control of the gas flow rates of controlling a gas supply time on the high flow rate side including the overshooting process of 3 seconds and a gas supply time on the low flow rate side including the undershooting process of 3 seconds. At this time, the duty ratio is 50%. At this time, an example of a gas flow rate control sequence and the result of the action of the gas flow rate of the $O_2$ gas is illustrated on the left side of FIG. 7.

(Duty Ratio: 66.7%)

An example of the gas flow rate control sequence and the result of the action of the gas flow rate of the $O_2$ gas under the duty ratio of 66.7% is illustrated on the center of FIG. 7. When the duty ratio is 66.7%, performed is a periodical gas flow rate control including the control time on the high flow rate side including the overshooting process (e.g., 0.5 second) is 4 seconds as illustrated in the upper portion of the center of FIG. 7, and the control time on the low flow rate side including the undershooting process (e.g., 0.5 second) is 2 seconds as illustrated in the lower portion of the center of FIG. 7.

In this case also, the gas flow rate immediately reaches a set flow rate value at the time of switching the gas as illustrated in the lower portion of the center of FIG. 7 in comparison with a case where there is no overshooting and undershooting processes. Therefore, the gas of the appropriate flow rate can be supplied into the chamber 10 within a short time.

(Duty Ratio: 33.3%)

An example of the gas flow rate control sequence and the result of the action of the gas flow rate of the $O_2$ gas under the duty ratio of 33.3% is illustrated on the right side of FIG. 7. When the duty ratio is 33.3%, performed is a periodical gas flow rate control including the control time on the high flow rate side including the overshooting process (e.g., 0.5 second) is 2 seconds as illustrated in the upper portion of the right side of FIG. 7, and the control time on the low flow rate side including the undershooting process (e.g., 0.5 second) is 4 seconds as illustrated in the lower portion of the right side of FIG. 7.

In this case also, the gas flow rate immediately reaches the set flow rate value at the time of switching the gas as illustrated in the lower portion of the right side of FIG. 7 in comparison with the case where there is no overshooting and undershooting processes. Therefore, the gas of the appropriate flow rate can be supplied into the chamber 10.

As described above, in the gas supplying method of the embodiment, the flow rate value of the gas is periodically switched between the high flow rate value and the low flow rate value, and the duty ratio of periodically switching between the high flow rate value and the low flow rate value is controlled to be the appropriate value. Thus, the gas flow rate immediately reaches the set flow rate value at the time of switching the gas and the gas of the appropriate flow rate can be supplied into the chamber 10 within a shorter time.

In the gas supplying method of the embodiment described above, the control times of the undershooting process and the overshooting process are set to be the appropriate value based on the state of the emission intensity of the plasma detected by the end point detection apparatus 80. Further, the duty ratio being a timing for switching the gas is controlled to be the appropriate value. Thus, the gas of the appropriate flow rate is supplied into the chamber 10 by the above control of the time.

Meanwhile, an effect similar to the control of the time is obtainable by a control of the flow rate. For example, in the gas supplying method, the flow rate during the rising time in the overshooting process may be controlled to be greater than the third flow rate value (see FIG. 4) or the flow rate during the falling time in the undershooting process may be controlled to be smaller than the fourth flow rate value.

However, if a difference between the flow rate value in the overshooting process and the high flow rate value or a difference between the flow rate value in the undershooting process and the low flow rate value becomes excessively large, the rising time or the falling time is prolonged. Further, an additional time is necessary for changing from a rising state or a falling state to a steady flow rate.

Therefore, in the gas supplying method of the embodiment, the duty ratio is controlled without excessively increasing the difference between the flow rate value in the overshooting process and the high flow rate value and the difference between the flow rate value in the undershooting process and the low flow rate value. With this, because the gas can be quickly caused to flow at the set flow rate at the time of switching the flow rate, one cycle can be set to have a short cycle length of an order of several seconds. With this the timing of switching the gas flow rate can be controlled at a high speed so as to obtain predetermined plasma properties.

Another Example

As another example, described is a case where the gas supplying method of the embodiment is applied to a reactive gas other than an $O_2$ gas. Within the embodiment, there is supplied a mixed gas of a $C_4F_8$ gas (Octafluorocyclobutane: perfluorocyclobutane gas), an argon (Ar) gas, a nitrogen ($N_2$) gas, and an $O_2$ gas. The control unit 100 supplies the mixed gas by changing the flow rate of the $C_4F_8$ gas and without changing the flow rates of the Ar gas, the $N_2$ gas, and the $O_2$ gas.

The control unit 100 cyclically repeats a process (an example of the first process) of supplying the mixed gas whose $C_4F_8$ gas is set to be the high flow rate value (an example of the first flow rate value) for several seconds and a process (an example of the second process) of supplying the mixed gas whose $C_4F_8$ gas is set to be the low flow rate value (an example of the second flow rate value) for several seconds. At this time, the overshooting process (an example of the third process) of supplying the $C_4F_8$ gas at the flow rate value (an example of the third flow rate value) greater than the high flow rate value is instantaneously performed immediately before the first process. At this time, the undershooting process (an example of the fourth process) of supplying the $C_4F_8$ gas at the flow rate value (an example of the fourth flow rate value) smaller than the low flow rate value is instantaneously performed immediately before the second process. The other major process conditions of the embodiment are as follows: the pressure is 80 mT (10.67 Pa); and the first high frequency power and the second high frequency power are applied.

Figure 8:
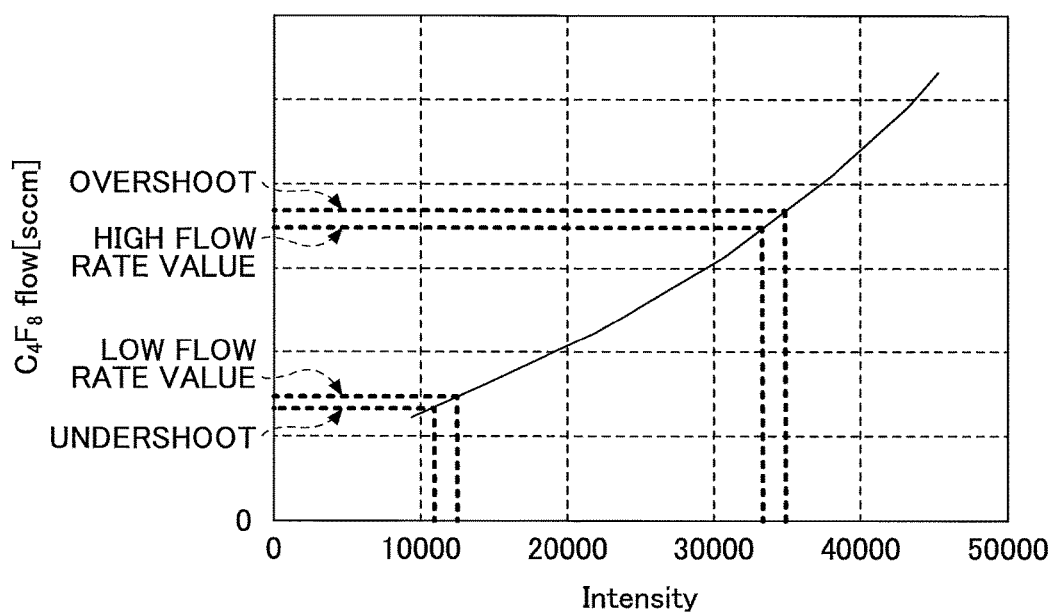
FIG. 8 is a graph illustrating an exemplary correlative relationship between the emission intensity of plasma and a flow rate of a $C_2F_8$ gas of the embodiment.

Within the embodiment, the high flow rate value and the low flow rate value of the $C_4F_8$ gas are set based on the correlative graph between the emission intensity of the plasma and the flow rate of the $C_4F_8$ gas, illustrated in FIG. 8 as an example. Further, the flow rate value of the $C_4F_8$ gas in the overshooting process and the undershooting process are set based on the correlative graph illustrated in FIG. 8. The correlative graph illustrated in FIG. 8 is previously stored in the RAM 115 or the like.

Figure 9:
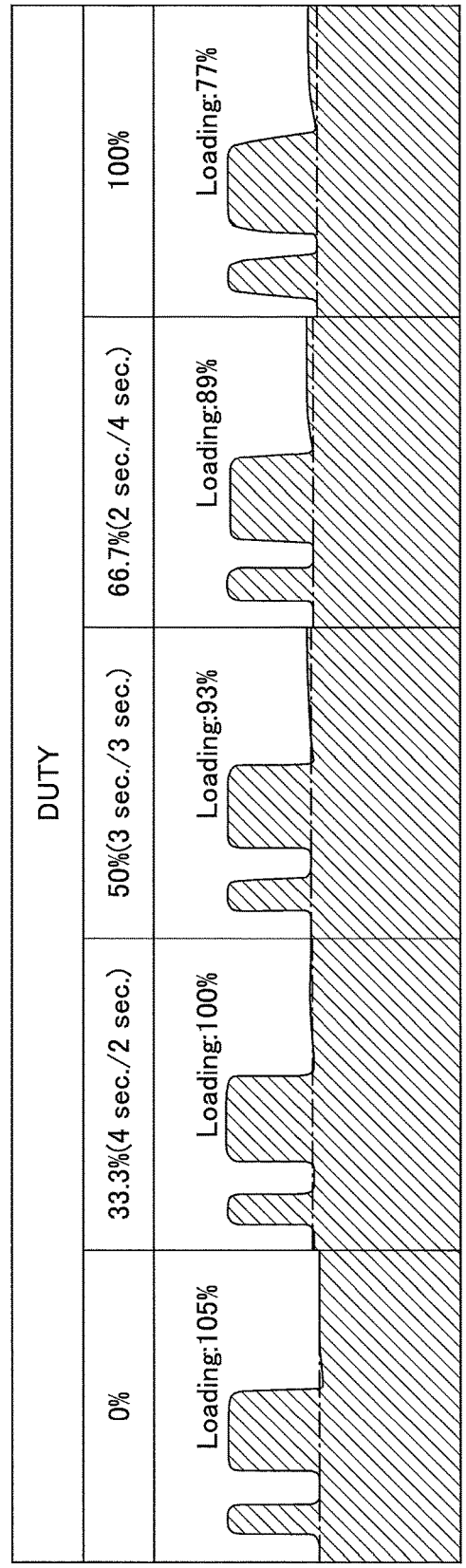
FIG. 9 illustrates an exemplary effect of a gas supplying process of the embodiment.
Figure 10:
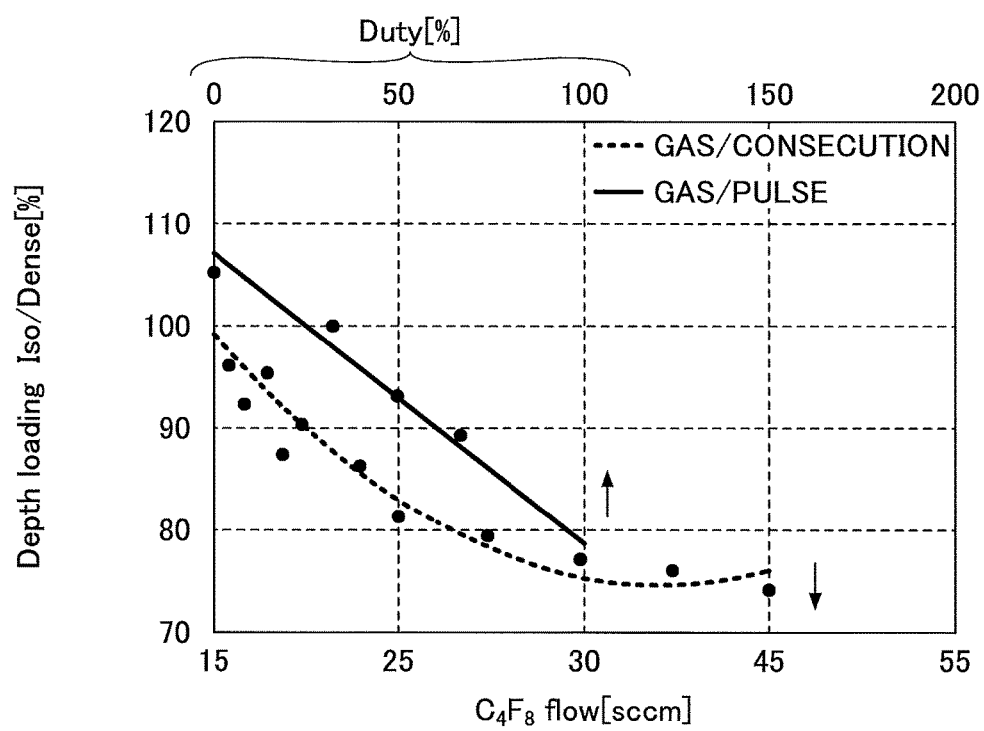
FIG. 10 illustrates an exemplary effect of a gas supplying process of the embodiment.

FIGS. 9 and 10 illustrate an example of a result of performing the gas supplying method of the embodiment in the conditions of the embodiment. Referring to FIGS. 9 and 10, illustrated are etching states when the duty ratio are controlled to be 0%, 33.3%, 50%, 66.7%, and 100%. A variation of shapes after etching to a dense and coarse pattern is indicated as "Loading".

Referring to FIG. 9, when the duty ratio is 0%, the etching shape is obtained as a result of the etching to the dense and coarse pattern in a case where the pulse control is not performed in a state where the $C_4F_8$ gas is set to flow at the low flow rate value.

When the duty ratio is 33.3%, the etching shape is obtained as a result of the etching to the dense and coarse pattern in a case where the pulse control is performed in a state where the gas supply time on the high flow rate side including the overshooting process is 2 seconds and the gas supply time on the low flow rate side including the undershooting process is 4 seconds.

When the duty ratio is 33.3%, the etching shape is obtained as a result of the etching to the dense and coarse pattern in a case where the pulse control is performed in a state where the gas supply time on the high flow rate side including the overshooting process is 3 seconds and the gas supply time on the low flow rate side including the undershooting process is 3 seconds.

When the duty ratio is 66.7%, the etching shape is obtained as a result of the etching to the dense and coarse pattern in a case where the pulse control is performed in a state where the gas supply time on the high flow rate side including the overshooting process is 4 seconds and the gas supply time on the low flow rate side including the undershooting process is 2 seconds.

When the duty ratio is 100%, the etching shape is obtained as a result of the etching to the dense and coarse pattern in a case where the pulse control is not performed in a state where the $C_4F_8$ gas is set to flow at the high flow rate value.

According to the results, as the loading approaches closer to 100%, the variation of the shape after etching the dense and coarse pattern is lessened, and a good etching property is obtainable regardless of the size of the hole size. Said differently, as the loading is closer to 100%, a so-called micro-loading is further restricted.

Referring to FIG. 10, the solid line indicates the value of the loading (the ordinate) for the dense and coarse pattern, the value being obtained as a result of performing the gas supplying method of the embodiment at the duty ratio (the abscissa) in the conditions of this other example.

The broken line indicates the value of the loading (the ordinate) for the dense and coarse pattern, the value being obtained by continuously supplying the $C_4F_8$ gas at the flow rate indicated below the abscissa without performing the gas supplying method of the embodiment in the conditions of the other example.

In the case of continuously supplying the $C_4F_8$ gas according to the broken line, the value of the loading becomes smaller than 100%. On the other hand, in the case where the gas supplying method of the embodiment is adopted so as to perform the pulse control of the flow rate of the $C_4F_8$ gas, it is possible to control the value of the loading so as to be closer to 100% by controlling the duty ratio. From this result, it is known that the control of effectively restricting the micro-loading is possible by controlling the duty ratio at a time of performing the pulse control of the flow rate of the process gas in comparison with the case where the flow rate of the supplied process gas is continuous.

As described, in the gas supplying method of the embodiment, by providing the undershooting process and the overshooting process in the pulse control of the gas flow rate, it is possible to cause the flow rate of the gas to instantaneously reach the set flow rate after cyclically switching the gas. Therefore, it is possible to supply the gas of the appropriate flow rate into the chamber 10. Resultantly, the so-called micro-loading can be prevented and a desirable etching process can be applied to the wafer W.

[Undershooting Process and Overshooting Process]

In the gas supplying method of the embodiment, the time for the undershooting process and the time for the overshooting process are controlled to be the same. However, there may be a case where the time for the undershooting process and the time for the overshooting process are different in their lengths depending on properties of the gas flow rate controller 16. Especially, in a case where an accuracy of adjusting the flow rate using the valve of the gas flow rate controller 16 is relatively low, it is preferable to set the time for the undershooting process to be longer than the time for the overshooting process.

Depending on the gas flow rate controller 16, the falling time at the time of switching the high flow rate value of the gas to the low flow rate value of the gas in the undershooting process tends to be longer than the rising time at the time of switching the low flow rate value of the gas to the high flow rate value of the gas in the overshooting process. The reason why the falling time tends to be longer than the rising time is that a gas having a high flow rate can be smoothly supplied from an upstream side (the side of the gas supply source 15) of the gas flow rate controller 16 when the opening degree of the valve of the gas flow rate controller 16 is controlled because the pressure on the upstream side is higher than the pressure inside the gas flow rate controller 16.

On the other hand, the reason why the falling time at the time of switching the high flow rate value of the gas to the low flow rate value of the gas in the undershooting process becomes longer than the rising time at the time of switching the low flow rate value of the gas to the high flow rate value of the gas in the overshooting process is that an orifice is provided inside the gas flow rate controller 16 and a flow path of the gas is narrowed inside the orifice. Therefore, when the high flow rate value of the gas is switched to the low flow rate value of the gas, the inside of the orifice is needed to be evacuated so as to decrease the inner pressure of the gas flow rate controller 16 including the inside of the orifice. Therefore, there may be a case where the time for the undershooting process is set to be longer than the time for the overshooting process in consideration of an evacuation time for decreasing the inner pressure of the gas flow rate controller 16.

As described above, the gas supplying method and the semiconductor manufacturing apparatus are described in the embodiment and the example.

For example, in the embodiment and the example, the flow rate value of the single gas or the mixed gas is subjected to the pulse control to have the high flow rate value and the low flow rate value. For example, the process of setting the flow rate value of a desired gas A to the two flow rate values of the high and low flow rates and processing the substrate by supplying the gas A of the high flow rate (including the overshooting process) and the process of processing the substrate by supplying the gas A of the low flow rate (including the undershooting process) are repeatedly performed. The gas supplying method of the embodiment can be applicable to a case where the kinds of the gases set to the high and low flow rates are changed and gases of multiple species are alternately supplied. For example, the flow rate value of the gas A may be set greater than the flow rate value of the gas B and the gas A and the gas B may be alternately supplied like a pulse. In this case, by providing the overshooting process or the undershooting process immediately before switching the flow rate value of the gas A and the flow rate value of the gas B, it is possible to perform the pulse control of the gas flow rate supplying the gas at appropriate gas flow rate values of the gases A and B.

The reactive gas used to apply the gas supplying method of the embodiment of the present invention is not limited to the $O_2$ gas or the $C_4F_8$ gas. For example, the gas supplying method of the embodiment of the present invention is applicable in a case where the $C_4F_8$ gas or another reactive gas is supplied into the inside of a semiconductor manufacturing apparatus. Further, the gas applicable to the gas supplying method of the embodiment of the present invention is not limited to an etching gas and may be a gas for depositing the film and a gas for ashing.

Further, within the embodiment, the high flow rate value and the low flow rate value of the gas at the time of performing the pulse control of the gas flow rate, and the flow rate values in the overshooting process and the undershooting process are limited to values set in a recipe or parameters. However, the control unit of the embodiment of the present invention may be controlled in real time during the process.

When the high flow rate value of the gas, the low flow rate value of the gas, the flow rate value in the overshooting process, or the flow rate value in the undershooting process is controlled in real time, the control unit acquires the emission intensity of plasma detected by the end point detection apparatus 80 illustrated in FIG. 2. The control unit 100 calculates the flow rate of the specific gas for acquiring the emission intensity of the plasma in response to the detected emission intensity based on the graph indicative of the correlative relationship between the emission intensity and the flow rate of the specific gas illustrated in FIGS. 4 and 8. The control unit 100 performs a real time control of the high flow rate value of the gas, the low flow rate value of the gas, the flow rate value in the overshooting process, or the flow rate value in the undershooting process by controlling these flow rate values based on the calculated flow rate values of the specific gas. With this, the gas can be controlled to have a more appropriate flow rate value in the pulse control of the gas flow rate.

The semiconductor manufacturing apparatus of the embodiment of the present invention can be applied not only to the plasma processing apparatus of a capacity-coupled type (capacitively coupled plasma: CCP)) but also to another semiconductor manufacturing apparatus. The other semiconductor manufacturing apparatus is an plasma apparatus of an inductively-coupled type (inductively coupled plasma: ICP), a chemical vapor deposition (CVD) apparatus using a radial line slot antenna, a plasma apparatus of a helicon wave excitation type (helicon wave plasma: HWP), or a plasma apparatus of an electron cyclotron resonance (electron cyclotron resonance plasma: ECR).

Further, the substrate processed by the semiconductor manufacturing apparatus of the embodiment of the present invention is not limited to the wafer W and may be applicable to, for example, a large sized substrate for a flat panel display, an EL element, or a substrate for a solar cell.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the gas supplying method has been described in detail, it should be understood that the various changes, substitutions, and alterations could be made hereto without departing from the spirit and scope of the invention.

What is claimed is:

1. A gas supplying method of supplying a process gas containing a gas of at least one gaseous species into a process space in a semiconductor manufacturing apparatus, the gas supplying method comprising:
    a first step of supplying the process gas containing the gas by controlling a flow rate value of the gas to be a first flow rate value during a first period;
    a second step of supplying the process gas containing the gas by controlling the flow rate value of the gas to be a second flow rate value smaller than the first flow rate value during a second period;
    a third step of supplying the process gas containing the gas by controlling the flow rate value of the gas to be a third flow rate value greater than the first flow rate value during a third period; and
    a fourth step of supplying the process gas containing the gas by controlling the flow rate value of the gas to be a fourth flow rate value smaller than the second flow rate value during a fourth period,
    wherein one cycle, which has only four periods of the first period, the second period, the third period, and the fourth period corresponding to the first step, the second step, the third step, and the fourth step in a predetermined order, is periodically repeated, and
    wherein the predetermined order in the one cycle is that the fourth step is immediately before the second step, the third step is immediately before the first step, and the second step is before the first step.

2. The gas supplying method according to claim 1,
    wherein the process space is a plasma generation space where plasma is generated from the process gas,
    wherein a data group indicative of a correlations between the flow rate of the gas and an emission intensity of the plasma generated in the plasma generation space is acquired by detecting the emission intensity relative to the flow rate of the gas and stored in a memory unit comprising a non-transitory computer readable medium,
    wherein the third flow rate value and the fourth flow rate value are set by converting a detection value of the emission intensity of the plasma generated in the plasma generation space to the flow rate value of the gas based on the correlations between the flow rate of the gas and the emission intensity of the plasma of the gas.

3. The gas supplying method according to claim 2,
    wherein the third flow rate value is appropriately determined based on a comparative result obtained by comparing the converted flow rate value and the first flow rate value,
    wherein the fourth flow rate value is appropriately determined based on a comparative result obtained by comparing the converted flow rate value and the second flow rate value.

4. The gas supplying method according to claim 1, wherein the first flow rate value, the second flow rate value, the third flow rate value, and the fourth flow rate value are positive values.

5. The gas supplying method according to claim 1, wherein the flow rate value of the gas of the at least one gaseous species is controlled for each of the first period, the second period, the third period, and the fourth period.

6. The gas supplying method according to claim 1, wherein the fourth period is longer than the third period.

* * * * *